(12) United States Patent
Khieu et al.

(10) Patent No.: US 6,493,790 B1
(45) Date of Patent: Dec. 10, 2002

(54) TRANSLATION-LOOKASIDE BUFFER WITH CURRENT TRACKING REFERENCE CIRCUIT

(75) Inventors: Cong Khieu, San Jose, CA (US); Xin Liu, Sunnyvale, CA (US); Der-ren Chu, San Jose, CA (US); Lan Lee, Palo Alto, CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/016,207

(22) Filed: Jan. 30, 1998

(51) Int. Cl.[7] .......................... G06F 12/10; G11C 15/00
(52) U.S. Cl. ...................... 711/108; 711/202; 711/206; 365/189.07
(58) Field of Search ................................ 711/108, 202, 711/203, 205, 206, 207; 365/49, 189.05, 189.07, 189.01

(56) References Cited

U.S. PATENT DOCUMENTS

| 5,034,919 A | * | 7/1991 | Sasai et al. | 365/49 |
|---|---|---|---|---|
| 5,471,189 A | * | 11/1995 | Dietz et al. | 340/146.2 |
| 5,517,441 A | * | 5/1996 | Dietz et al. | 365/49 |
| 5,539,911 A | * | 7/1996 | Nguyen et al. | 712/23 |
| 5,617,348 A | * | 4/1997 | Maguire | 365/49 |
| 5,659,697 A | * | 8/1997 | Dietz | 711/207 |
| 5,717,885 A | * | 2/1998 | Kumar et al. | 711/207 |

* cited by examiner

Primary Examiner—Tuan V. Thai
(74) Attorney, Agent, or Firm—Pennie & Edmonds LLP (57) ABSTRACT

A translation-lookaside buffer includes a content-addressable memory (CAM) cell to generate a CAM current signal with a first transistor configuration having a set of transistors of a predetermined size and connection. A reference current circuit generates a reference current signal with a second transistor configuration corresponding to the first transistor configuration, with the exception of the size and connection of selected transistors. A match sense amplifier selectively generates a match signal in response to the CAM current signal and the reference current signal.

22 Claims, 10 Drawing Sheets

TRANSLATION-LOOKASIDE BUFFER WITH CURRENT TRACKING REFERENCE CIRCUIT

BRIEF DESCRIPTION OF THE INVENTION

This invention relates generally to translation-lookaside buffers (TLBs). More particularly, this invention relates to a TLB with a reference current circuit that improves the processing yield of the TLB.

BACKGROUND OF THE INVENTION

Figure 1:
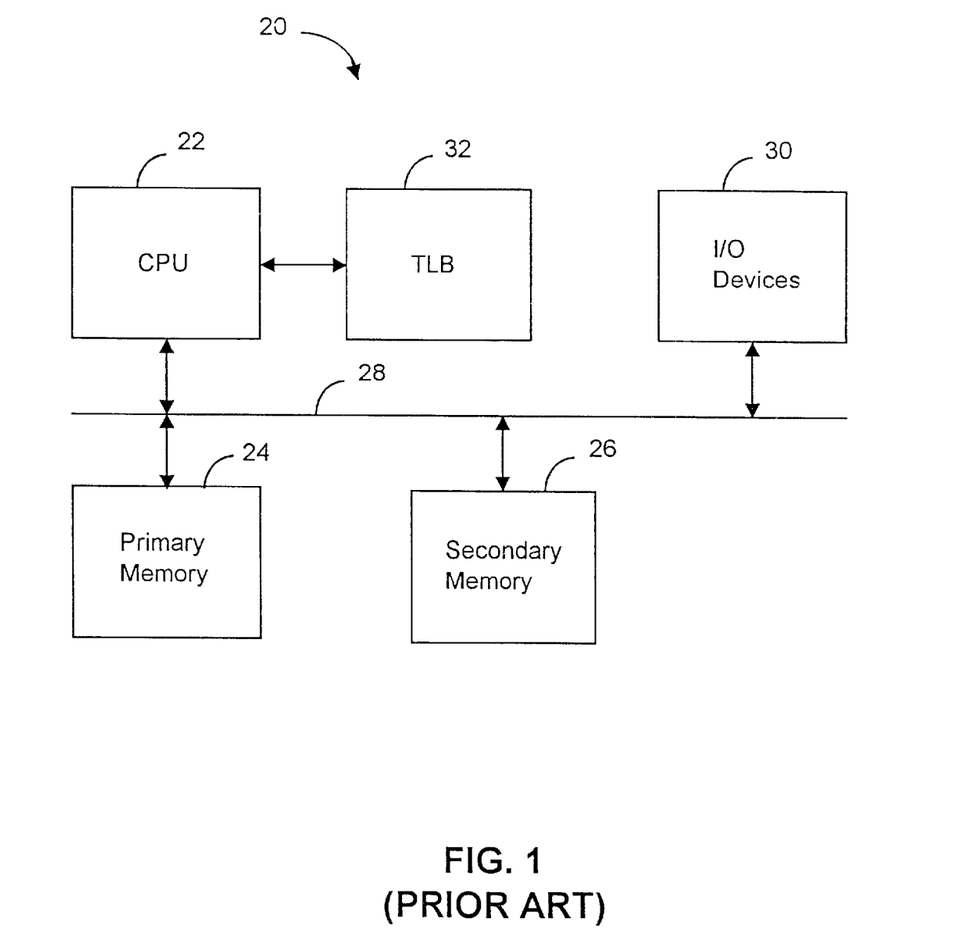
FIG. 1 is a prior art computer system that includes a translation-lookaside buffer (TLB).

FIG. 1 illustrates a general purpose computer 20 that includes a central processing unit (CPU) 22 that communicates with primary memory (generally random-access memory or RAM) 24 and secondary memory (generally disk storage) 26 over a system bus 28. Input/output (I/O) devices 30, such as monitors or keyboards, are also connected to system bus 28.

CPU 22 executes one or more computer programs stored in primary memory 24. Most instructions and data in a computer program have a corresponding virtual address. Each virtual address is then translated to a physical address located in primary memory 24. If the required information is not in primary memory 24, then a page fault occurs, and CPU 22 loads the required information from secondary memory 26 into primary memory 24.

The use of virtual addresses in a computer is a technique commonly referred to as "virtual memory." Practically all general purpose computers rely upon virtual memory. Virtual memory allows a computer to execute a program that includes a range of addresses that may exceed the primary memory capacity of the computer. Thus, programmers are not restricted by primary memory size considerations, and the programs are portable between hardware environments with different primary memory capacities.

Translation of virtual addresses to physical addresses is performed by an operating system running on general purpose computer 20 using page tables stored in primary memory 24 or secondary memory 26. The page tables contain a set of page table translation entries, each of which maps a virtual address to a corresponding physical address. Each page table translation entry contains a virtual page number associated with the virtual address and a physical page number associated with the physical address corresponding to the virtual address. The operating system accesses the page tables whenever a virtual-to-physical address translation is required.

To improve the performance of page tables, modem computers include a special cache, called a translation-lookaside buffer (TLB), that keeps track of recently used translations. Referring to FIG. 1, computer 20 includes a TLB 32 coupled to CPU 22.

Figure 2:
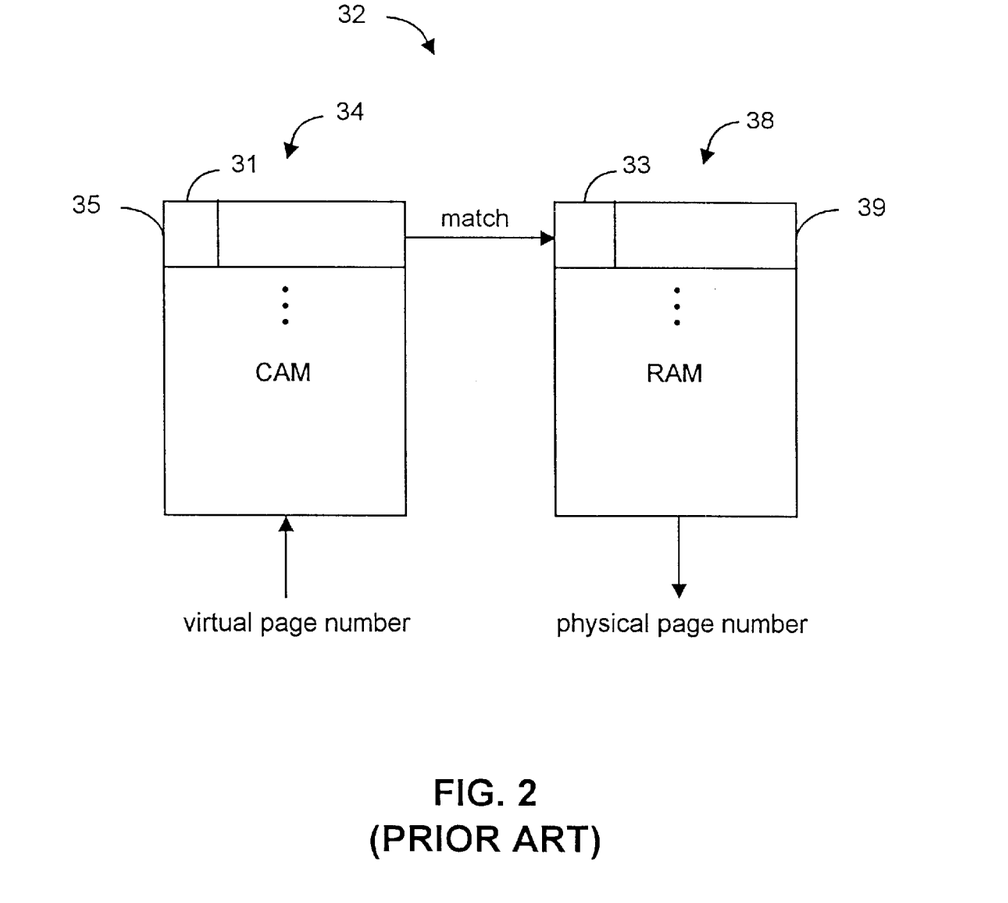
FIG. 2 is a simplified block diagram of a prior art TLB.

FIG. 2 illustrates a simplified block diagram of TLB 32. TLB 32 comprises a content-addressable memory (CAM) 34 and a random-access memory (RAM) 38. CAM 34 comprises a set of CAM rows 35 each containing a plurality of CAM cells 31. Each CAM row 35 contains a virtual page number comprising the higher-order bits of a virtual address. RAM 38 comprises a set of RAM rows 39 each containing a plurality of RAM cells 33. Each RAM row 39 contains a physical page number comprising the higher-order bits of the physical address. Each RAM row 39 is paired with one of the CAM rows 35. Each RAM row 39 contains the physical page number corresponding to the virtual page number contained in the paired CAM row 35.

Continuing to refer to FIG. 2, TLB 32 performs a translation of a virtual address to a physical address as follows. First, CAM 34 is provided with the virtual page number of the virtual address to be translated. Next, each CAM row 35 in CAM 34 compares the virtual page number provided to the CAM with the virtual page number stored in the row. If the provided virtual page number matches the stored virtual page number (i.e., a CAM row "hit"), CAM row 35 asserts a match signal. If the page numbers do not match (i.e., a CAM row "miss"), the match signal is not asserted. If a CAM row hit occurs, the match signal generated by CAM row 35 causes the corresponding RAM row 39 to output the physical page number stored in the row. The physical page number is then used by CPU 22 to construct the physical address.

In a TLB using pseudo-differential sensing, the match signal is generated by a match sense amplifier (not shown) in CAM row 35. The match sense amplifier compares the CAM signal generated by the CAM cells in CAM row 35 to a reference signal generated by a reference circuit (not shown) to determine whether a CAM row hit or miss occurred. Specifically, the match sense amplifier determines whether the voltage or current of the CAM signal is greater or less than that of the reference signal. If a CAM row hit is determined to have occurred based on this comparison, the match sense amplifier asserts the match signal. Otherwise, the match sense amplifier does not assert the match signal.

One problem experienced by prior art TLBs using pseudo-differential sensing is a lack of "tracking" between the CAM signal and reference signal. The voltage or current of the CAM and reference signals is subject to change due to variations in the process used to fabricate TLB 32 or in the power supply voltage provided to different sections of the TLB. Furthermore, the voltage or current of the CAM and reference signals generally vary independently of each other, i.e., they do not "track" each other. This is because in prior art TLBs the CAM and reference signals are typically generated by separate circuits having different transistor configurations. Under certain process or voltage conditions, the voltage or current relationship between the CAM signal and reference signal may change such that the match sense amplifier incorrectly senses a CAM row hit or miss. If this condition occurs, TLB 32 will not function properly and cannot be used. Therefore, the lack of tracking between the CAM signal and reference signal decreases the processing yield of the TLB.

Another problem experienced by prior art TLBs using pseudo-differential sensing is the difficulty in adjusting the voltage or current level of the reference signal. The reference signal is adjusted to place it in proper relation to the CAM signal level such that the match sense amplifier can correctly determine whether a CAM row hit or miss occurred. In prior art TLBs, the reference signal is typically adjustable through only a limited range of voltage or current levels. Furthermore, it is difficult to fine tune the voltage or current levels of the reference signal under varying process or voltage conditions because the reference signal adjustments may affect the tracking between the reference and CAM signals. If the reference signal level cannot be adjusted accurately, the match sense amplifier is susceptible to incorrectly sensing a CAM row hit or miss. Therefore, the difficulty in adjusting the reference signal level also decreases the processing yield of the TLB.

In view of the shortcomings of the prior art, it would be highly desirable to provide a TLB with a reference circuit that improves the processing yield of the TLB.

SUMMARY OF THE INVENTION

The present invention is a translation-lookaside buffer that includes a content-addressable memory (CAM) cell to generate a CAM current signal with a first transistor configuration having a set of transistors of a predetermined size and connection. A reference current circuit generates a reference current signal with a second transistor configuration corresponding to the first transistor configuration, with the exception of the size and connection of selected transistors. A match sense amplifier selectively generates a match signal in response to the CAM current signal and the reference current signal.

In one embodiment of the present invention, the reference current circuit comprises a reference current generator and a current limiting circuit, the current limiting circuit comprises a plurality of programmable transistors configurable in a predefined conducting state.

The translation-lookaside buffer of the present invention provides an improved yield in two ways: (1) the reference current circuit has a transistor configuration similar to that of the CAM cells so that the reference current signal tracks the signals generated by the CAM cells despite variations in process or power supply voltage conditions and (2) the reference current circuit includes a programmable current limiting circuit that is capable of adjusting the reference current to the desired level without affecting tracking.

BRIEF DESCRIPTION OF THE DRAWINGS

For a better understanding of the nature and objects of the invention, reference should be made to the following detailed description taken in conjunction with the accompanying drawings, in which.

Like reference numerals refer to corresponding parts throughout the several views of the drawings.

DETAILED DESCRIPTION OF THE INVENTION

Figure 3:
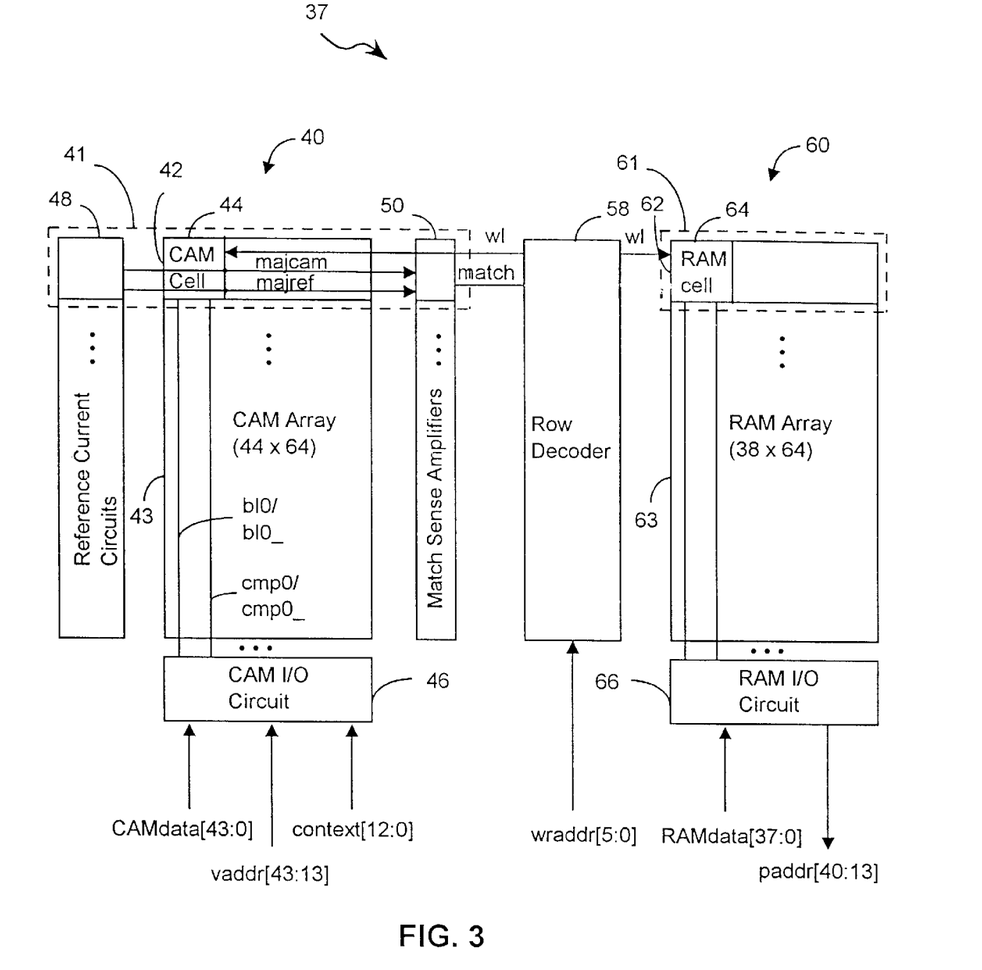
FIG. 3 is a block diagram of a TLB in accordance with an embodiment of the invention.

FIG. 3 is a block diagram of a TLB 37 in accordance with an embodiment of the invention. TLB 37 includes a content-addressable memory (CAM) 40, a random-access memory (RAM) 60, and a row decoder 58.

CAM 40 is organized as a plurality of CAM rows 41. Each CAM row 41 contains data organized into one or more fields (not shown). Each CAM row 41 outputs a match signal that indicates whether the data provided to CAM 40 matches the data stored in the CAM row (i.e., a CAM row "hit"). Each CAM row 41 comprises a CAM cell row 42, a reference current circuit 48, and a match sense amplifier 50, as described in more detail below. In one embodiment of the invention, CAM row 41 contains 44 bits, including a 31 bit virtual page number field and a 13 bit context field.

CAM 40 includes a CAM array 43. CAM array 43 comprises a plurality of CAM cell rows 42. Each CAM cell row 42 contains a plurality of CAM cells 44, each cell capable of storing a binary value. Each CAM cell row 42 generates a CAM signal majcam that indicates whether the data provided to CAM 40 matches the data stored in the CAM cell row. In one embodiment of the invention, CAM array 43 comprises 64 rows, each row containing 44 CAM cells.

CAM 40 also includes a CAM input/output (I/O) circuit 46 connected to CAM array 43. In one embodiment of the invention, CAM I/O circuit 46 receives the signals CAMdata[43:0], vaddr[43:13], and context[12:0], among others, from CPU 22. The signal CAMdata[43:0] provides the data to be stored in one of CAM cell rows 42 during a write operation. For each bit of signal CAMdata[43:0], CAM I/O circuit 46 outputs a bit line signal and its complement, bl[i]/bl[i]_, where i=0 to 43, for receipt by CAM cells 44 of CAM cell rows 42. The signal vaddr[43:13] comprises a 31 bit virtual page number comprising the higher-order bits of the virtual address to be translated. The signal context[12:0] comprises a 13 bit context associated with the virtual address. The signals vaddr[43:13] and context[12:0] provide the data to be compared with the contents of CAM cell rows 42 during an address translation operation. For each bit of signals vaddr[43:13] and context [12:0], CAM I/O circuit 46 outputs a compare signal and its complement, cmp[i]/cmp[i]_, where i=0 to 43, for receipt by CAM cells 44 in CAM array rows 42.

CAM 40 additionally includes a plurality of reference current circuits 48, one for each CAM cell row 42. Each reference current circuit 48 outputs a reference current signal majref.

CAM 40 further includes a plurality of match sense amplifiers 50, one for each CAM cell row 42. Each match sense amplifier 50 receives the majcam and majref signals output by the corresponding CAM cell row 42 and reference current circuit 48, respectively. Each match sense amplifier 50 generates a match signal based on a comparison of the two signals, as described in greater detail below.

RAM 60 of TLB 37 is organized as a plurality of RAM rows 61. Each RAM row 61 contains data organized into one or more fields (not shown). Each RAM row 61 receives a word line signal (wl) from the row decoder 58. As known in the art, the row decoder 58 generates the word line signal by combining the word line signal and match signal it receives from the match sense amplifiers 50. In one embodiment of the invention, RAM row 61 contains 38 bits, including a 28 bit physical page number field.

RAM 60 includes a RAM array 63. RAM array 63 comprises a plurality of AM rows 61. Each RAM row 61 contains a plurality of RAM cells 64, each cell capable of storing a binary value. Each RAM row 61 receives the word line signal generated by the corresponding CAM cell row 42 and responds by selectively outputting the data stored in the row. In one embodiment of the invention, RAM array 63 comprises 64 rows, each row containing 38 RAM cells.

RAM 60 also includes a RAM input/output (I/O) circuit 66 connected to RAM array 63. RAM I/O circuit 66 receives a signal RAMdata[37:0], among others, from CPU 22. The signal RAMdata[37:0] comprises the data to be stored in one of the RAM rows 61 during a write operation. RAM I/O circuit 66 also outputs a signal paddr[40:13] for receipt by CPU 22. The signal paddr[40:13] comprises the 28 bit physical page number output from the RAM row 61 that receives an asserted match signal. The signal paddr[40:13] is used by CPU 22 to construct the physical address corresponding to the provided virtual address.

Row decoder 58 of TLB 37 is a row address decoder connected to both CAM array 40 and RAM array 60. Row decoder 58 receives a write address signal wraddr[5:0] from CPU 22 during a write operation. Write address signal wraddr[5:0] specifies the row of CAM array 43 or RAM array 63 for writing the CAMdata[43:0] or RAMdata[37:0] signals, respectively. Row decoder 58 outputs a word line signal wl for each row of CAM array 43 and RAM array 63. During a write operation, row decoder 58 asserts the word line signal wl for the row in CAM array 43 or RAM array 63 corresponding to write address signal wraddr[5:0] so that the respective data is written to that row.

Figure 4:
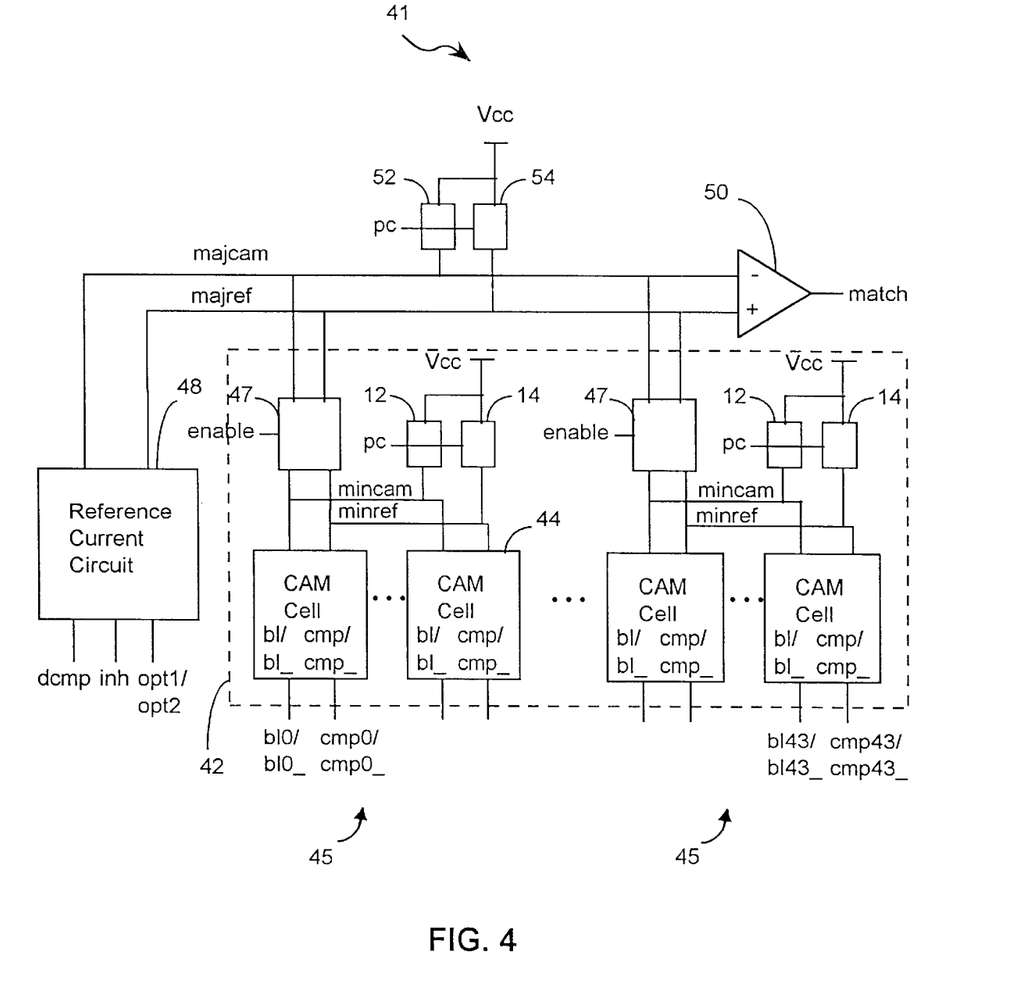
FIG. 4 is a block diagram of a CAM row of the TLB shown in FIG. 3.

FIG. 4 is a block diagram of one of the CAM rows 41 of TLB 37. CAM row 41 comprises CAM cell row 42, reference current circuit 48, precharge devices 12, 14, 52, and 54, and match sense amplifier 50. CAM row 41 also includes a majcam signal line for transmitting the majcam signal generated by CAM cell row 42 to match sense amplifier 50. CAM row 41 further includes a majref signal line for transmitting the majref signal generated by reference current circuit 48 to match sense amplifier 50.

CAM cell row 42 includes a plurality of CAM cells 44, one CAM cell for each bit of CAM row 41. In one embodiment of the present invention, CAM cell row 42 includes 44 CAM cells corresponding to a 44 bit CAM row. CAM cell row 42 also includes a plurality of inputs connected to CAM cells 44 for receiving the bit line signals bl[i]/bl[i]_ from CAM I/O circuit 46. As mentioned earlier, the bit line signals bl[i]/bl[i]_ provide the data to be written to the CAM array row during a write operation. CAM cell row 42 additionally includes a plurality of inputs for receiving the compare signals cmp[i]/cmp[i]_ from CAM I/O circuit 46. As mentioned earlier, the compare signals cmp[i]/cmp[i]_ provide the data to be compared with the contents of the CAM array row during an address translation operation. CAM cell row 42 further includes a plurality of outputs connected to the majcam and majref signal lines. The outputs connected to the majcam signal line collectively generate the majcam signal that indicates whether the data provided by the cmp[i]/cmp[i]_ signals matches the data stored in the CAM cell row (i.e., a CAM row hit). The outputs connected to the majref signal line are provided to equalize the capacitive load between the majcam and majref signal lines, as explained in greater detail below.

The CAM cells 44 of CAM cell row 42 are organized into a plurality of CAM cell groups 45. Each CAM cell group 45 corresponds to a portion of CAM cell row 42 that may be selectively included or excluded from comparison with the compare signals cmp[i]/cmp[i]_. Portions of CAM row 41 may be selectively excluded from comparison so that TLB 37 can translate virtual addresses having various page sizes. This feature also enables TLB 37 to selectively exclude the context associated with the virtual address from comparison. In one embodiment of the invention, CAM cell row 42 comprises six CAM cell groups 45: two 11 bit and three 3 bit groups for storing a virtual page number having a maximum of 31 bits and one 13 bit group for storing a 13 bit context.

Each CAM cell 44 of CAM cell group 45 includes a bl and bl_input for receiving the corresponding bit line signals bl[i] and bl[i]_ from CAM I/O circuit 46. As mentioned earlier, the bit line signals bl[i]/bl[i]_ provide the data to be written to the CAM cell row during a write operation. Each CAM cell 44 also includes a cmp and cmp_input for receiving the corresponding compare signals cmp[i] and cmp[i]_ from CAM I/O circuit 46. As mentioned earlier, the compare signals cmp[i]/cmp[i]_ provide the data to be compared with the contents of the CAM cell row during an address translation operation. Each CAM cell 44 additionally includes a mincam output for generating a mincam signal that indicates whether the data provided to the cmp/cmp_inputs matches the contents of the cell. Each CAM cell 44 further includes a minref output that presents a capacitive load. The minref output is provided to equalize the capacitive load between the majcam and majref signal lines, as explained in greater detail below.

Each CAM cell group 45 includes a mincam and minref signal line to which the mincam and minref output, respectively, of each CAM cell 44 in the CAM cell group is connected. As a result, the mincam outputs of the CAM cells in CAM cell group 45 are combined on the mincam signal line to indicate whether the data provided by compare signals cmp[i]/cmp[i]_ matches the contents of the entire CAM cell group 45.

Each CAM cell group 45 additionally includes a current limiting device 47. Current limiting device 47 includes mincam and minref inputs connected to the mincam and minref signal lines, respectively. Current limiting device 47 also includes majcam and majref outputs connected to the majcam and majref signal lines, respectively. The majcam output indicates a data match or mismatch for the respective CAM cell group 45. Current limiting device 47 further includes an input connected to an enable signal generated by a control circuit (not shown) of TLB 37. If the enable signal is asserted, current limiting device 47 couples the mincam and minref signal lines to the majcam and majref signal lines, respectively. In one embodiment of the invention, current limiting device 47 comprises two p-channel transistors connected between the mincam and majcam signal lines and the minref and majref signal lines, respectively.

Current limiting device 47 performs two functions: (1) it selectively couples or decouples the respective CAM cell group 45 from the majcam and majref signal lines so that the CAM cell group is included or excluded from the comparison operation and (2) it reduces the capacitive load presented by the CAM cell group to the majcam and majref signal lines. As mentioned earlier, the first function enables TLB 37 to translate virtual addresses having various page sizes and to selectively exclude the context from comparison. The second function increases the speed at which CAM row 41 generates the match signal.

The majcam and majref outputs of each CAM cell group 45 in CAM cell row 42 are connected to the majcam and majref signal lines, respectively. As a result, the majcam outputs of the CAM cell group 45 in CAM cell row 42 are combined on the majcam signal line to indicate a data match or mismatch for the entire CAM row.

Reference current circuit 48 of CAM row 41 includes a reference signal output majref connected to the majref signal line. The majref output is used to supply the reference current signal majref. Reference current circuit 48 also includes a majcam output connected to the majcam signal line. The majcam output is provided to equalize the capacitive load between the majcam and majref signal lines, as explained in greater detail below. In some embodiments of the invention, explained below, multiple reference current circuits 48 may be used.

Reference current circuit 48 has a similar circuit and layout configuration to CAM cell 44 of CAM cell row 42. Reference current circuit 48 is designed in this manner so that the majref signal output by reference current circuit 48 tracks the majcam signal output by the CAM array row across varying process or voltage conditions, as explained in greater detail below.

Precharge devices 12, 14, 52, and 54 of CAM row 41 are connected to the mincam, minref, majcam, and majref signal lines, respectively. Precharge devices 12, 14, 52, and 54 receive a precharge signal pc to precharge their respective signal lines to the power supply voltage Vcc. These signal lines are precharged as part of a precharge/evaluate function provided by the precharge devices in conjunction with CAM cell row 42 and reference current circuit 48, as described in greater detail below. In one embodiment of the invention, precharge devices 12, 14, 52, and 54 are p-channel transistors.

Match sense amplifier 50 of CAM row 41 is a standard current sense amplifier. Match sense amplifier 50 includes an input connected to the majcam signal line for receiving the majcam signal output by CAM array row 42. Match sense amplifier 50 also includes an input connected to the majref signal line for receiving the majref signal output by reference current circuit 48. Match sense amplifier 50 further includes an output for generating the match signal indicating a CAM row hit or miss.

During an address translation operation, match sense amplifier 50 compares the level of the current $I_{majcam}$ generated by the majcam signal with the level of the current $I_{majref}$ generated by the majref signal to determine whether a CAM row hit or miss occurred. In one embodiment of the invention, if match sense amplifier 50 senses that the level of current $I_{majcam}$ is greater than that of current $I_{majref}$, the match sense amplifier de-asserts the match signal to indicate a CAM row miss. Conversely, if match sense amplifier 50 senses that the level of current $I_{majcam}$ is less than that of current $I_{majref}$, the match sense amplifier asserts the match signal to indicate a CAM row hit.

CAM row 41 is configured such that the circuit path generating the majref signal is similar to the circuit path generating the majcam signal. The circuits paths are matched so that the majref signal tracks the majcam signal across varying process and power supply voltage conditions. The circuit path for the majref signal is matched to the circuit path for the majcam signal in two ways. First, reference current circuit 48 is provided with a circuit and layout configuration similar to that of CAM cell 44. Second, the capacitive load for the majcam and majref signal lines are equalized by connecting CAM cell row 42 and reference current circuit 48 to both signal lines even though they each output a signal on only one of the lines. If CAM cell row 42 and reference current circuit 48 were only connected to the majcam and majref signal lines, respectively, the majcam signal line would have a much heavier capacitive load than the majref signal line because CAM cell row 42 has a greater number of circuit elements than reference current circuit 48.

Figure 5:
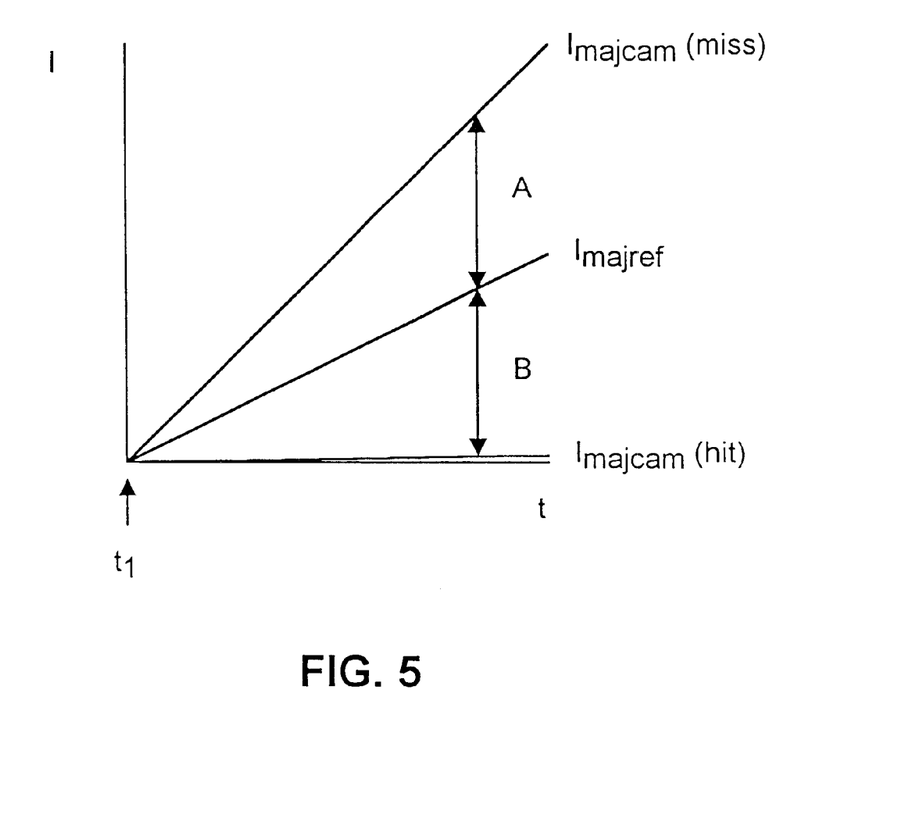
FIG. 5 is a graph showing the current generated by the CAM cell row and the reference current circuit shown in FIG. 4.

FIG. 5 is a graph showing the current $I_{majcam}$ generated by CAM cell row 42 and the current $I_{majref}$ generated by reference current circuit 48 during an address translation operation. As shown in the figure, CAM cell row 42 and reference current circuit 48 begin to generate a current when they are enabled at a time $t_1$, and generate increasing amounts of current thereafter. CAM cell row 42 is capable of generating two general levels of the current $I_{majcam}$: (1) a current $I_{majcam}$ (hit) generated during a CAM row hit and (2) a current $I_{majcam}$ (miss) generated during a CAM row miss. In the embodiment of the invention illustrated by the figure, current $I_{majcam}$ (hit) is essentially zero while current $I_{majcam}$ (miss) is a nonzero value. The level of current $I_{majcam}$ (miss) can vary widely depending on how many CAM cells 44 in CAM cell row 42 indicate a mismatch and are thus generating current. The minimum level of current $I_{majcam}$ (miss) above the reference current $I_{majref}$ is generated when a single CAM cell 44 in CAM array row 42 indicates a mismatch.

Referring to FIG. 5, the level of current $I_{majref}$ generated by reference current circuit 48 is located between the levels of currents $I_{majcam}$ (miss) and $I_{majcam}$ (hit). Match sense amplifier 50 compares the level of the current $I_{majcam}$ with the level of the current $I_{majref}$ to determine whether a CAM row hit or miss occurred. In the embodiment of the invention illustrated by the figure, if match sense amplifier 50 senses that the level of current $I_{majcam}$ is greater than that of current $I_{majref}$, the match sense amplifier deasserts the match signal to indicate a CAM row miss. Conversely, if match sense amplifier 50 senses that the level of current $I_{majcam}$ is less than that of current $I_{majref}$, the match sense amplifier asserts the match signal to indicate a CAM row hit. Ideally, the level of current $I_{majref}$ is centered between the levels of currents $I_{majcam}$ (miss) and $I_{majcam}$ (hit) such that A=B. This positioning of $I_{majref}$ ensures that match sense amplifier 50 correctly senses the relationship between the levels of currents $I_{majcam}$ and $I_{majref}$ despite any current fluctuations that may occur.

As mentioned previously, CAM row 41 is constructed such that the current $I_{majref}$ generated by reference current circuit 48 tracks the current $I_{majcam}$ generated by CAM cell row 42 across varying process and power supply voltage conditions. This ensures that the level of current $I_{majref}$ remains approximately centered between the levels of currents $I_{majcam}$ (miss) and $I_{majcam}$ (hit). As a result, TLB 41 is less likely to generate erroneous CAM row hits or misses despite variations in process or voltage, thereby improving the processing yield of the TLB.

Figure 6:
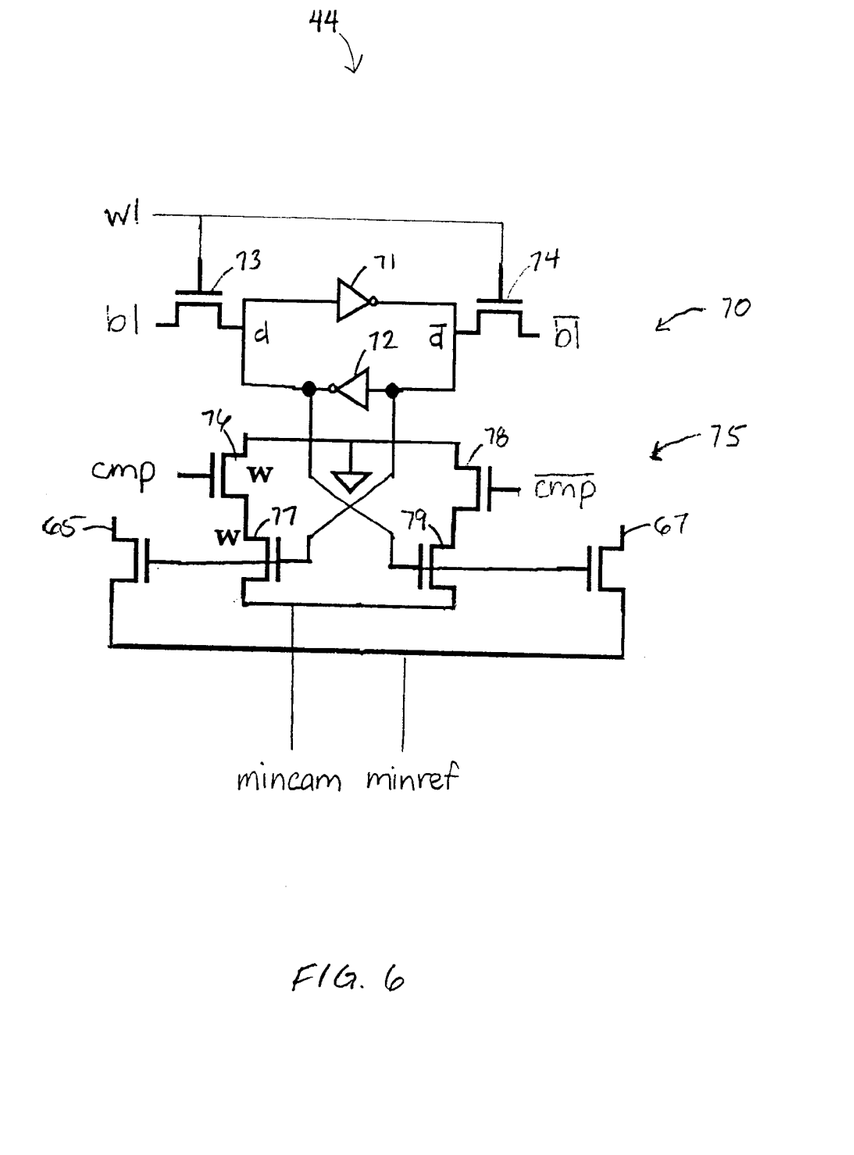
FIG. 6 is a circuit diagram of an embodiment of the CAM cell shown in FIG. 4.

FIG. 6 is a circuit diagram of an embodiment of CAM cell 44 using a ten-transistor configuration. CAM cell 44 comprises a memory portion 70 and a comparator portion 75. Memory portion 70 stores the data contained in CAM cell 44. Memory portion 70 includes cross-coupled inverters 71 and 72. Cross-coupled inverters 71 and 72 store the CAM cell data on nodes d and d_. Memory portion 70 also includes pass transistors 73 and 74. The gates of pass transistors 73 and 74 are connected to a word line wl. Word line wl receives the respective word line signal wl output by row decoder 58. The sources of pass transistors 73 and 74 are connected to bit lines bl and bl, respectively. Bit lines bl and bl_ receive the respective bit line signals bl[i] and bl[i]_ from CAM I/O circuit 46. During a write operation, word line signal wl is asserted so that the data provided by bit line signals bl[i] and bl[i]_ is stored on nodes d and d_, respectively.

Comparator portion 75 of CAM cell 44 compares the data provided to CAM cell 44 with the CAM cell contents. Comparator portion 75 includes transistors 76, 77, 78, and 79 configured to execute an exclusive-OR (XOR) logical operation between the stored signal and the input compare signal. Series transistors 76 and 77 are connected in parallel with series transistors 78 and 79 between the mincam output of the CAM cell and ground. The gate of transistor 76 receives the respective compare signal cmp[i] from CAM I/O circuit 46. The gate of transistor 77 is connected to node d_ of memory portion 70. The gate of transistor 78 receives the respective compare signal cmp[i]_ from CAM I/O circuit 46. The gate of transistor 79 is connected to node d of memory portion 70.

The mincam output of comparator portion 75 is connected to precharge transistors 12 and 52 (shown in FIG. 4) via the mincam and majcam signal lines, respectively. During a precharge phase of an address translation operation, the pc signal is asserted so that precharge transistors 12 and 52 precharge signal lines mincam and majcam, respectively, to Vcc. During an evaluate phase of the address translation operation, the cmp[i] and cmp[i]_ signals are supplied to comparator portion 75 for comparison with the data stored in the CAM cell. If the data provided by the cmp[i] signal does not match the CAM cell contents, comparator portion 75 discharges the mincam and majcam signal lines through either transistors 76 and 77 or transistors 78 and 79, thereby producing a current $I_{mincam}$ (miss) with a logical high value. If the data provided by the cmp[i] signal matches the CAM cell contents, comparator portion 75 does not discharge the mincam and majcam signal lines, thereby producing a current $I_{mincam}$ (hit) of approximately zero, a logical low value.

The channel width of transistors 76, 77, 78, and 79 determines the current $I_{mincam}$ (miss). In one embodiment of the invention, transistors 76, 77, 78, and 79 each have the same channel width w.

CAM cell 44 also includes two load transistors 65 and 67. The gates of load transistors 65 and 67 are connected to the d_ and d nodes, respectively, of cross-coupled inverters 71 and 72. The drains of load transistors 65 and 67 are connected to the signal line minref The sources of the transistors are left unconnected. Load transistors 65 and 67 are provided so that CAM cell 44 presents a similar capacitive load to the mincam and minref signal lines. This helps to equalize the capacitive loads of the majcam and majref signal lines so that the majref signal tracks the majcam signal.

Figure 7:
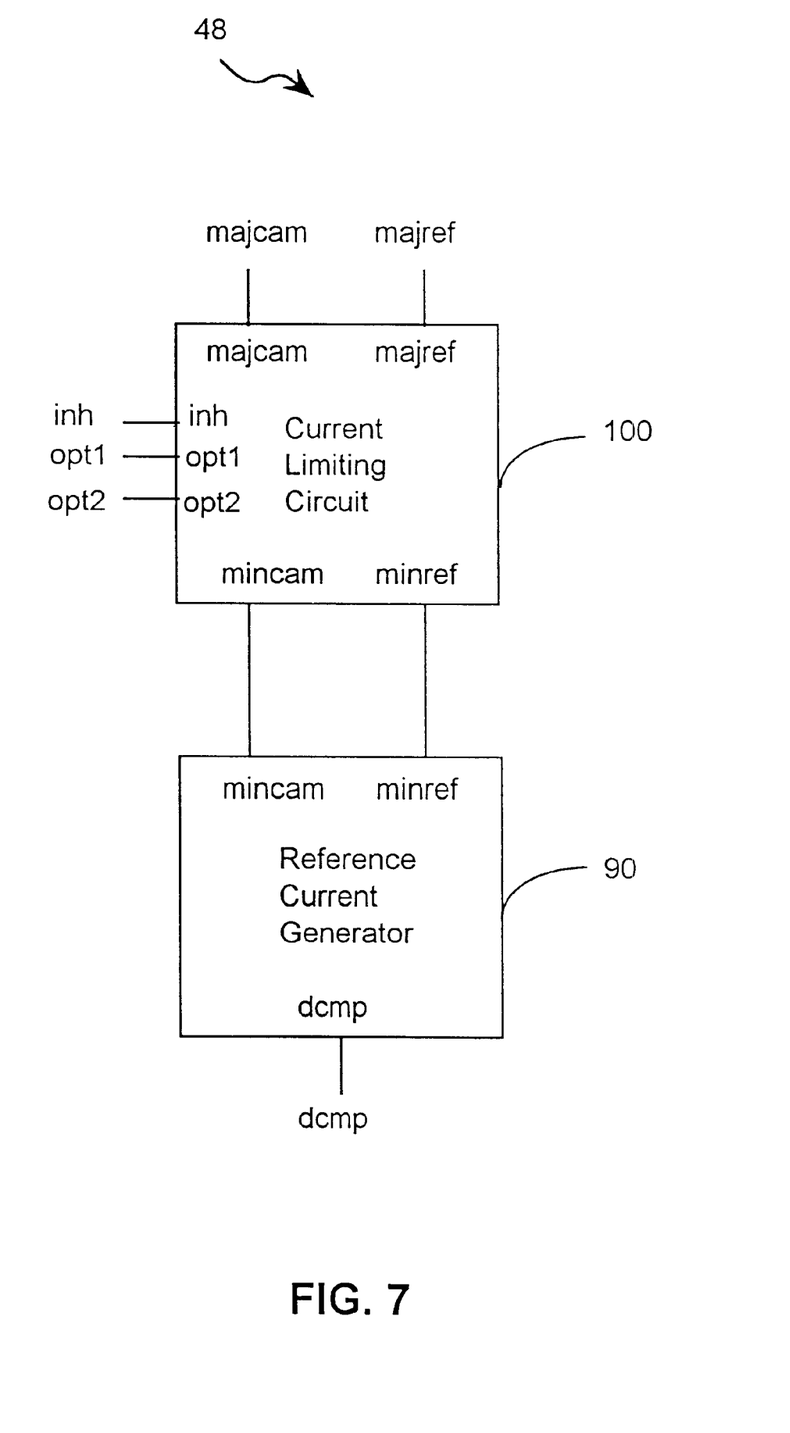
FIG. 7 is a block diagram of an embodiment of the reference current circuit shown in FIG. 4.

FIG. 7 is a block diagram of reference current circuit 48. Reference current circuit 48 includes a reference current generator 90 and a current limiting circuit 100. Reference current generator 90 generates the current $I_{majref}$ output by reference current circuit 48. Current limiting circuit 100 controls the current generated by reference current generator 90 so that the current $I_{majref}$ may be adjusted to a desired level.

Reference current circuit 48 has a configuration and operation resembling that of CAM array row 42. Reference current circuit 48 comprises two portions—reference current generator 90 and current limiting circuit 100—just as CAM array row 42 comprises two portions—CAM cell 44 and current limiting device 47. Furthermore, the transistor configurations of reference current generator 90 and current limiting circuit 100 are similar to those for CAM cell 44 and current limiting device 47, respectively. Therefore, the circuit path for the majref signal generated by reference current circuit 48 is similar to that for the majcam signal generated by CAM array row 42. As a result, the majref signal tracks the majcam signal across varying process or power supply voltage conditions.

Figure 8:
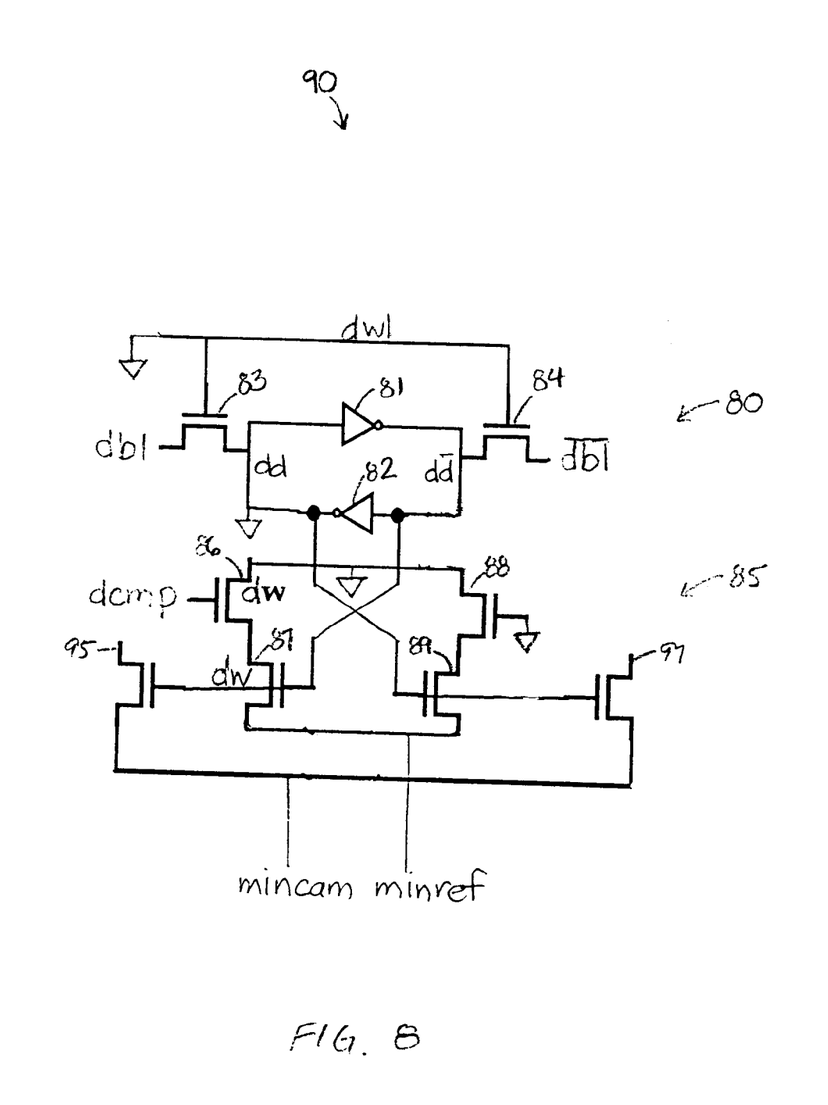
FIG. 8 is a circuit diagram of an embodiment of the reference current generator shown in FIG. 7.

FIG. 8 is a circuit diagram of an embodiment of reference current generator 90 of reference current circuit 48. Reference current generator 90 has a circuit and layout (i.e., transistor) configuration that is substantially the same as that of CAM cell 44. Reference current generator 90 differs from CAM cell 44 only with respect to the channel width of certain transistors and to the connections of certain circuit elements. In FIG. 8, the wordline dwl is grounded, the output of inverter 82 is grounded, the sources of transistors 86 and 88 are grounded, and the gate of transistor 88 is grounded, unlike the counter-part components in FIG. 6. Observe that these connections results in a number of the transistors being effectively removed from the logical signal processing because their states do not change.

Reference current generator 90 comprises a dummy memory portion 80 and a dummy comparator portion 85. Dummy memory portion 80 includes cross-coupled inverters 81 and 82. Cross-coupled inverters 81 and 82 include the nodes dd and dd_, of which node dd is connected to ground. Dummy memory portion 80 also includes pass transistors 83 and 84. The gates of pass transistors 83 and 84 are connected to a dummy word line dwl which is grounded. The sources of pass transistors 83 and 84 are connected to dummy bit lines dbl and dbl_, respectively. Dummy bit lines dbl and dbl_ are left unconnected.

Dummy comparator portion 85 of reference current generator 90 generates the reference current signal minref. Dummy comparator portion 85 includes transistors 86, 87, 88, and 89 in an exclusive-OR (XOR) configuration. Series transistors 86 and 87 are connected in parallel with series transistors 88 and 89 between the minref output of the reference current generator and ground. The gate of transistor 86 receives a dcmp signal generated by a dummy compare circuit (not shown) of TLB 37 having timing similar to that of the cmp[i]/cmp[i]_ signals. The gate of transistor 87 is connected to node dd_ of dummy memory portion 80. The gate of transistor 88 is connected to ground. The gate of transistor 89 is connected to node dd (i.e., ground) of dummy memory portion 80.

The minref output of dummy comparator portion 85 is connected to precharge transistors 14 and 54 (shown in FIG. 4) via the minref and majref signal lines, respectively, to generate the minref signal. During a precharge phase of an address translation operation, the pc signal is asserted so that precharge transistors 14 and 54 precharge signal lines minref and majref, respectively, to Vcc. During an evaluate phase of the address translation operation, the dcmp signal is asserted. This causes dummy comparator portion 85 to discharge the minref and majref signal lines through transistors 86 and 87, thereby producing a current $I_{minref}$.

The channel width of transistors 86 and 87 determines the current $I_{minref}$. In one embodiment of the invention, transistors 86 and 87 each have the same channel width dw that is one-half the channel width w of the transistors 76, 77, 78, and 79 of CAM cell 44. In this embodiment, the level of current $I_{minref}$ is approximately one-half the level of current $I_{mincam}$ (miss).

Reference current generator 90 also includes two load transistors 95 and 97. The gates of load transistors 95 and 97 are connected to the dd_ and dd nodes, respectively, of cross-coupled inverters 81 and 82. The drains of load transistors 95 and 97 are connected to the signal line mincam. The sources of the transistors are left unconnected. Load transistors 95 and 97 are provided so that reference current generator 90 presents a similar capacitive load to the mincam and minref signal lines. This helps to equalize the capacitive loads of the majcam and majref signal lines so that the majref signal tracks the majcam signal.

Figure 9:
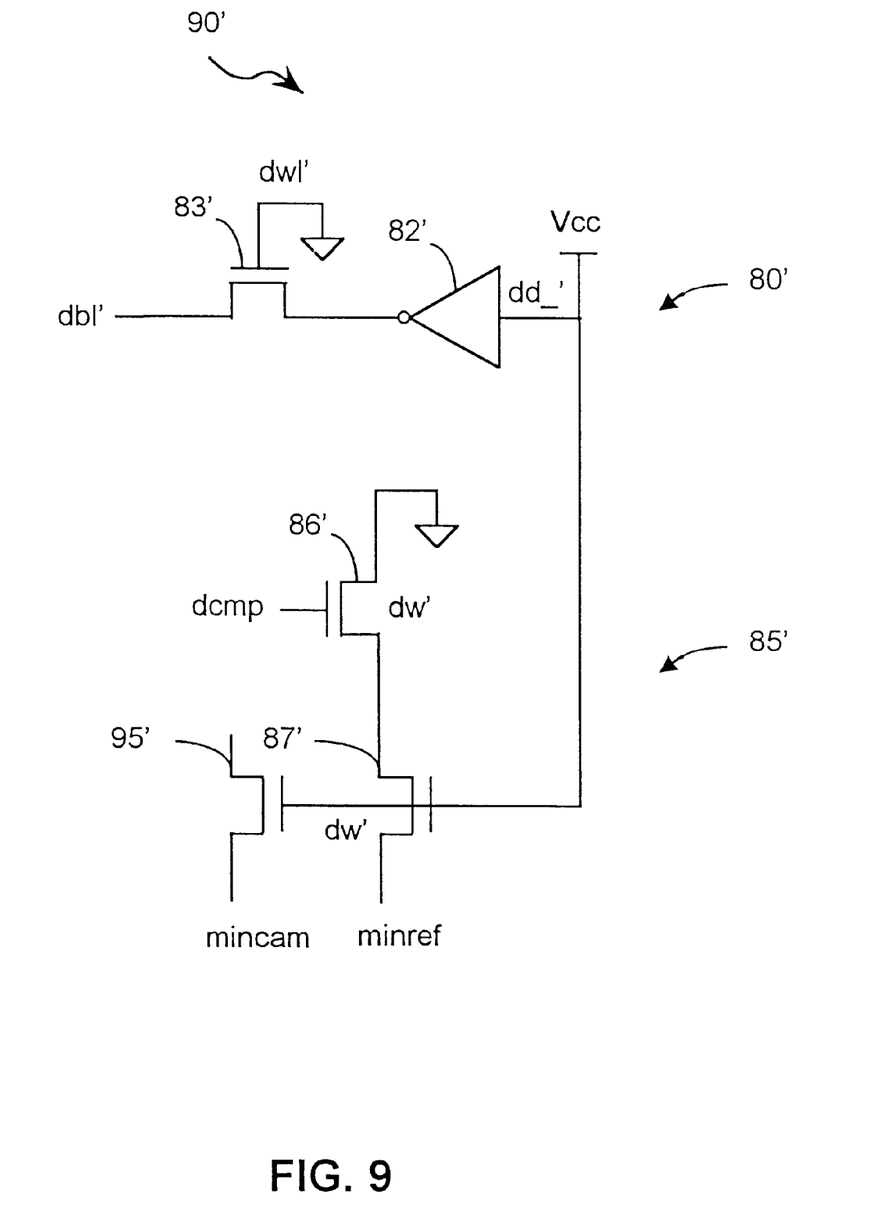
FIG. 9 is a circuit diagram of an alternative embodiment of the reference current generator shown in FIG. 7.

FIG. 9 is a circuit diagram of an alternative embodiment of the reference current generator, reference current generator 90'. Reference current generator 90' essentially comprises one half of reference current generator 90. This reduces the size of the reference current generator without significantly affecting the ability of the minref signal to track the mincam signal.

Reference current generator 90' comprises a dummy memory portion 80' and a dummy comparator portion 85'. Dummy memory portion 80' includes inverter 82' and pass transistor 83'. Inverter 82' includes the node dd_' which is connected to Vcc. The gate of pass transistor 83' is connected to a dummy word line dwl which is grounded. The source of pass transistor 83' is connected to dummy bit line dbl'. Dummy bit line dbl' is left unconnected.

Dummy comparator portion 85' of reference current generator 90' generates the reference current signal minref. Dummy comparator portion 85' includes transistors 86' and 87' in series between the minref output of the reference current generator and ground. The gate of transistor 86' receives a dcmp signal generated by a dummy compare circuit (not shown) of TLB 37 having timing similar to that of the cmp[i]/cmp[i] signals. The gate of transistor 87' is connected to node dd_' (i.e., Vcc) of dummy memory portion 80'.

The minref output of dummy comparator portion 85' is connected to precharge transistors 14 and 54 (shown in FIG. 4) via the minref and majref signal lines, respectively, to generate the minref signal. During a precharge phase of an address translation operation, the pc signal is asserted so that precharge transistors 14 and 54 precharge signal lines minref and majref, respectively, to Vcc. During an evaluate phase of the address translation operation, the dcmp signal is asserted. This causes dummy comparator portion 85' to discharge the minref and majref signal lines through transistors 86' and 87', thereby producing a current $I_{minref}$.

The channel width of transistors 86' and 87' determines the current $I_{minref}$. In one embodiment of the invention, transistors 86' and 87' each have the same channel width dw' that is one-half the channel width w of the transistors 76, 77, 78, and 79 of CAM cell 44. In this embodiment, the level of current $I_{minref}$ is approximately one-half the level of current $I_{mincam}$ (miss).

Reference current generator 90' also includes a load transistor 95'. The gate of load transistor 95' is connected to the dd_' node of inverter 82'. The drain of load transistor 95' is connected to the signal line mincam. The source of transistor 95' is left unconnected. Load transistor 95' is provided so that reference current generator 90' presents a similar capacitive load to the mincam and minref signal lines. This helps to equalize the capacitive loads of the majcam and majref signal lines so that the majref signal tracks the majcam signal.

Figure 10:
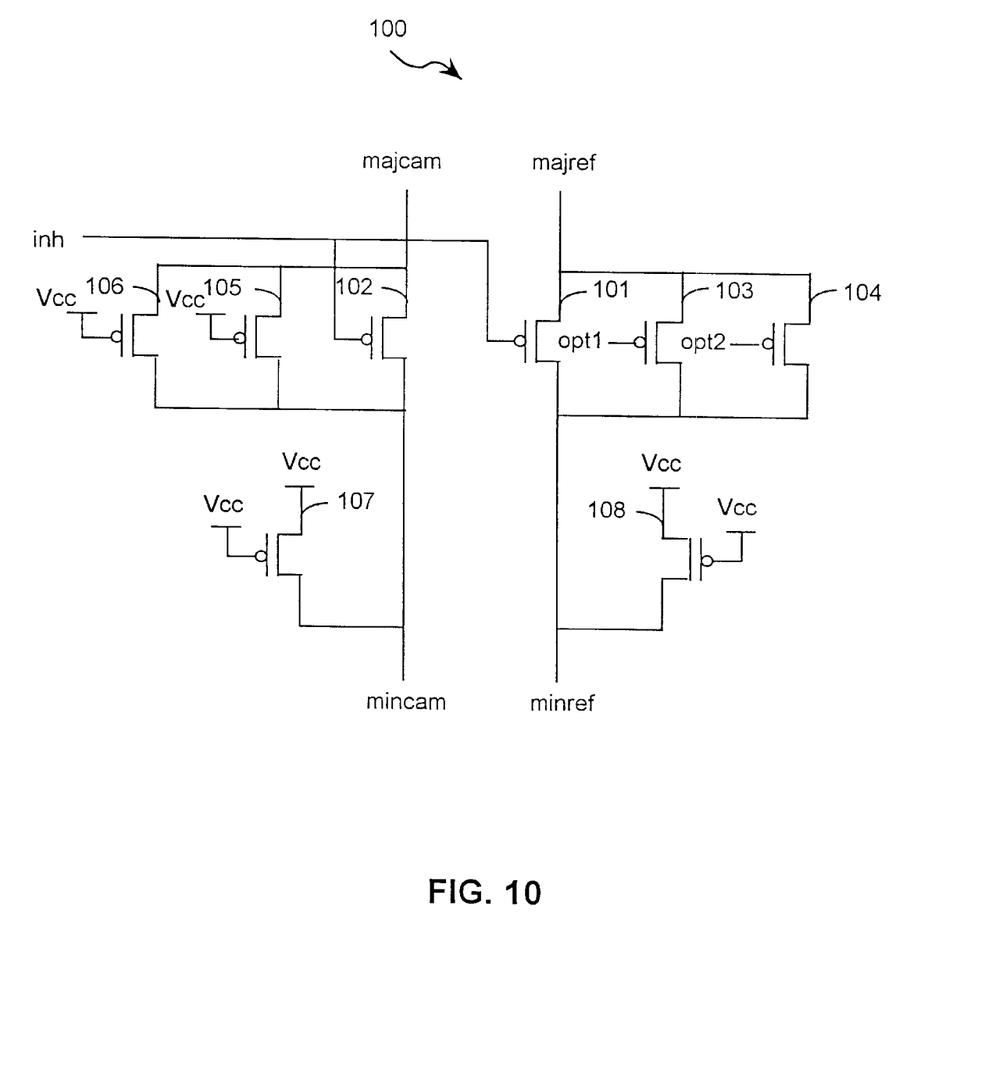
FIG. 10 is a circuit diagram of an embodiment of the current limiting circuit shown in FIG. 7.

FIG. 10 is a circuit diagram of an embodiment of current limiting circuit 100 of reference current circuit 48. Current limiting circuit 100 performs at least two functions: (1) it selectively decouples reference current circuit 48 from the majref signal line so that it does not output the reference current signal majref to the majref signal line and (2) it controls the level of the current $I_{majref}$ of the majref signal output by reference current circuit 48.

Current limiting circuit 100 has a circuit configuration resembling that of current limiting device 47 of CAM cell row 42. This helps the circuit path generating the majref signal to match the circuit path generating the majcam signal so that the majref signal tracks the majcam signal.

Current limiting circuit 100 includes a coupling transistor 101. The drain of transistor 101 is connected to the majref signal line. The source of transistor 101 is connected to the minref signal line. The gate of transistor 101 receives an inh signal generated by a control circuit (not shown) of TLB 37. If the inh signal is asserted (i.e., "0", which it typically is), current limiting circuit 100 couples reference current circuit 48 to the majref signal line, thereby enabling the reference current circuit to output the reference current signal majref onto the majref signal line. Current limiting circuit 100 also includes a dummy coupling transistor 102 connected to the majcam and mincam signal lines to equalize the capacitive load presented by the current limiting circuit to the majcam and majref signal lines.

Current limiting circuit 100 additionally includes current adjusting transistors 103 and 104. The drains of current adjusting transistors 103 and 104 are connected to the majref signal line. The sources of current adjusting transistors 103 and 104 are connected to the minref signal line. The gates of current adjusting transistors 103 and 104 receive opt1 and opt2 signals, respectively, generated by a programmable circuit (not shown) of TLB 37. Current limiting circuit 100 further includes dummy current adjusting transistors 105 and 106 connected to the majcam and mincam signal lines to equalize the capacitive load presented by the current limiting circuit to the majcam and majref signal lines.

Current adjusting transistors 103 and 104 are programmable to a conducting or nonconducting state to control the level of the current $I_{majref}$ output by reference current circuit 48. Depending on the desired level for current $I_{majref}$, one or both of current adjusting transistors 103 and 104 may be set to a conducting state. Current adjusting transistors 103 and 104 are set to a conducting or nonconducting state by programming the programmable circuit to assert (i.e., "0") or de-assert (i.e., "1") the opt1 and opt2 signals, respectively. In one embodiment, the programmable circuit is programmed by inserting or removing metal options from the circuit during fabrication of TLB 37.

Finally, current limiting circuit 100 includes dummy precharge transistors 107 and 108. The drains and gates of dummy precharge transistors 107 and 108 are connected to Vcc. The sources of dummy precharge transistors 107 and 108 are connected to the mincam and minref signal lines, respectively. Dummy precharge transistors 107 and 108 correspond to precharge transistors 12 and 14, respectively, of CAM cell row 42. Dummy precharge transistors 107 and 108 are provided so that the circuit path for the majref signal matches that for the majcam signal.

Since the level of current $I_{majref}$ output by reference current circuit 48 is adjusted using current limiting circuit 100, reference current generator 90 does not need to be modified, thereby preserving its similarity to CAM cell 44. As a result, the level of current $I_{majref}$ may be adjusted without affecting the ability of the majref signal to track the majcam signal.

In one embodiment of the invention, CAM row 41 includes multiple reference current circuits 48 that provide different levels of current $I_{majref}$. The reference current circuit 48 providing the desired level of current $I_{majref}$ is enabled by asserting (i.e., "0") the inh signal corresponding to that reference current circuit. The other reference current circuits 48 are disabled by deasserting (i.e., "1") their respective inh signals.

In summary, the present invention comprises a TLB with a reference current circuit that improves the processing yield of the TLB. The reference current circuit accomplishes this in two ways: (1) the reference current circuit has a transistor configuration similar to that of the CAM cells so that the reference current signal tracks the signals generated by the CAM cells and (2) the reference current circuit includes a programmable current limiting circuit that is capable of adjusting the reference current to the desired level without affecting tracking.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the invention are presented for purposes of illustration and description. They are not intended to be exhaustive or to limit the invention to the precise forms disclosed; obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following Claims and their equivalents.

What is claimed is:

1. A translation-lookaside buffer, comprising:
    a content-addressable memory (CAM) cell to generate a CAM current signal with a first transistor configuration having a plurality of transistors of a predetermined size and connection, wherein said CAM cell includes a memory portion and a comparator portion;
    a reference current circuit to generate a reference current signal with a second transistor configuration substantially similar to said first transistor configuration, with the exception of the size and connection of selected transistors, the second transistor configuration including a dummy memory portion and a dummy comparator portion, wherein the reference current circuit is distinct from any CAM cell in the translation-lookaside buffer and the reference current signal generated by the reference current circuit tracks the CAM current signal generated by the CAM cell with respect to changes in power supply voltage; and
    a match sense amplifier to selectively generate a match signal in response to said CAM current signal and said reference current signal.

2. The translation-lookaside buffer of claim 1 wherein said memory portion stores a bit and said comparator portion executes a logical XOR operation between said bit and an input signal to produce said CAM current signal.

3. The translation-lookaside buffer of claim 2 further comprising a major CAM current signal line connected between said CAM cell and said match sense amplifier.

4. The translation-lookaside buffer of claim 3 wherein said CAM cell constitutes an element of a CAM cell group comprising a plurality of CAM cells.

5. The translation-lookaside buffer of claim 4 wherein said CAM cell group has an associated current limiting device connected between said CAM cell group and said major CAM current signal line.

6. The translation-lookaside buffer of claim 5 further comprising a plurality of CAM cell groups connected to said major CAM current signal line.

7. The translation-lookaside buffer of claim 3 wherein said reference current circuit is connected to said major CAM current signal line and a major reference current signal line.

8. The translation-lookaside buffer of claim 7 wherein said CAM cell is connected to said major CAM current signal line and said major reference current signal line.

9. The translation-lookaside buffer of claim 1, wherein said reference current circuit comprises a reference current generator and a current limiting circuit, said current limiting circuit comprising a plurality of programmable transistors configurable in a predefined conducting state to establish a predetermined current level for said reference current signal.

10. The translation-lookaside buffer of claim 1 in combination with a central processing unit.

11. The translation-lookaside buffer of claim 10 in combination with a system bus connected to said central processing unit.

12. The translation-lookaside buffer of claim 11 in combination with a primary memory, a secondary memory, and input/output devices connected to said system bus.

13. The translation-lookaside buffer of claim 1 wherein said dummy memory circuit includes two cross-coupled inverters each having a node, wherein the node of one inverter is connected to ground.

14. The translation-lookaside buffer of claim 13 wherein said reference generator further comprises two load transistors having gates connected to said nodes of said cross-coupled inverters.

15. The translation-lookaside buffer of claim 1 wherein said dummy comparator circuit includes two pass transistors having gates connected to a grounded dummy word line.

16. The translation-lookaside buffer of claim 1 wherein said dummy memory circuit includes an inverter and a pass transistor having a gate connected to a grounded dummy word line and a source connected to an unconnected dummy bit line.

17. A method of comparing signals in a translation-lookaside buffer, said method comprising the steps of:
    generating a content-addressable memory (CAM) current signal with a first transistor configuration having a plurality of transistors of a predetermined size and connection, including a memory portion and a comparator portion;
    producing a reference current signal with a second transistor configuration substantially similar to said first transistor configuration, with the exception of the size and connection of selected transistors, wherein the reference current circuit is distinct from any CAM cell in the translation-lookaside buffer and the reference current signal generated by the reference current circuit tracks the CAM current signal generated by the CAM cell with respect to changes in power supply voltage; and
    combining said CAM current signal and said reference current signal to selectively produce a match signal.

18. The method of claim 17 wherein said generating step includes the step of executing a logical XOR operation between a stored bit and an input signal to produce said CAM current signal.

19. The method of claim 17 wherein said producing step includes the step of producing said reference current signal with said second transistor configuration wherein a plurality of transistors are connected so that their logic state does not change.

20. The method of claim 17 wherein said producing step includes the step of establishing a predefined reference current signal for said second transistor configuration through the use of a plurality of programmable transistors.

21. The method of claim 17 further comprising the step of applying said match signal to a central processing unit of a computer.

22. A translation-lookaside buffer, comprising:
    a content-addressable memory (CAM) cell to generate a CAM current signal with a first transistor configuration having a plurality of transistors of a predetermined size and connection, wherein said CAM cell includes a memory portion and a comparator portion;

a reference current circuit to generate a reference current signal with a second transistor configuration substantially similar to at least half of said first transistor configuration, wherein said reference current circuit including a dummy memory portion and a dummy comparator portion, wherein the reference current circuit is distinct from any CAM cell in the translation-lookaside buffer and the reference current signal generated by the reference current circuit tracks the CAM current signal generated by the CAM cell with respect to changes in power supply voltage; and a match sense amplifier to selectively generate a match signal in response to said CAM current signal and said reference current signal.

* * * * *